United States Patent [19]
Levine et al.

[11] Patent Number: 5,846,389
[45] Date of Patent: Dec. 8, 1998

[54] SPUTTERING TARGET PROTECTION DEVICE

[75] Inventors: Howard H. Levine, Ft. Lee; Neil J. Sullivan, Emerson, both of N.J.; Paul S. Gilman, Suffern, N.Y.

[73] Assignees: Sony Corporation, Tokyo, Japan; Materials Research Corporation, Orangeburg, N.Y.

[21] Appl. No.: 856,462

[22] Filed: May 14, 1997

[51] Int. Cl.$^6$ .................................................. C23C 14/34
[52] U.S. Cl. ............................. 204/192.1; 204/192.12; 204/298.01; 204/298.02; 204/298.12
[58] Field of Search .................................. 206/701, 709; 204/192.1, 298.01, 298.02, 298.12, 192.12

[56] References Cited

U.S. PATENT DOCUMENTS

| | | | |
|---|---|---|---|
| 4,909,695 | 3/1990 | Hurwitt et al. | 414/217 |
| 5,130,005 | 7/1992 | Hurwitt et al. | 204/192.12 |
| 5,232,091 | 8/1993 | Hennessy et al. | 206/219 |
| 5,284,561 | 2/1994 | Shinneman et al. | 204/192.13 |
| 5,336,386 | 8/1994 | Marx et al. | 204/298.12 |
| 5,474,667 | 12/1995 | Hurwitt et al. | 204/192.12 |
| 5,529,673 | 6/1996 | Strauss et al. | 204/298.12 |

FOREIGN PATENT DOCUMENTS

| | | | |
|---|---|---|---|
| 2-159372 | 6/1990 | Japan | 204/298.12 |
| 4-231461 | 8/1992 | Japan . | |

*Primary Examiner*—Nam Nguyen
*Assistant Examiner*—Rodney G. McDonald
*Attorney, Agent, or Firm*—Wood, Herron & Evans, LLP

[57] ABSTRACT

A sputtering target protection device for covering and protecting the precisely machined and engineered surface of a sputtering target assembly during shipment, intermediate handling and installation of the target assembly. The protection device includes a top wall preferably having the same general circumferential configuration as the top surface of the target, and an integral skirt which depends from the top wall. The depending skirt is adapted to frictionally engage a side surface of the sputtering target while the top wall of the protection device is spaced from the sputtering surface to cover and protect the surface during shipment and installation of the target assembly. The protection device is designed to be single-use and disposable. Methods are also disclosed.

19 Claims, 1 Drawing Sheet

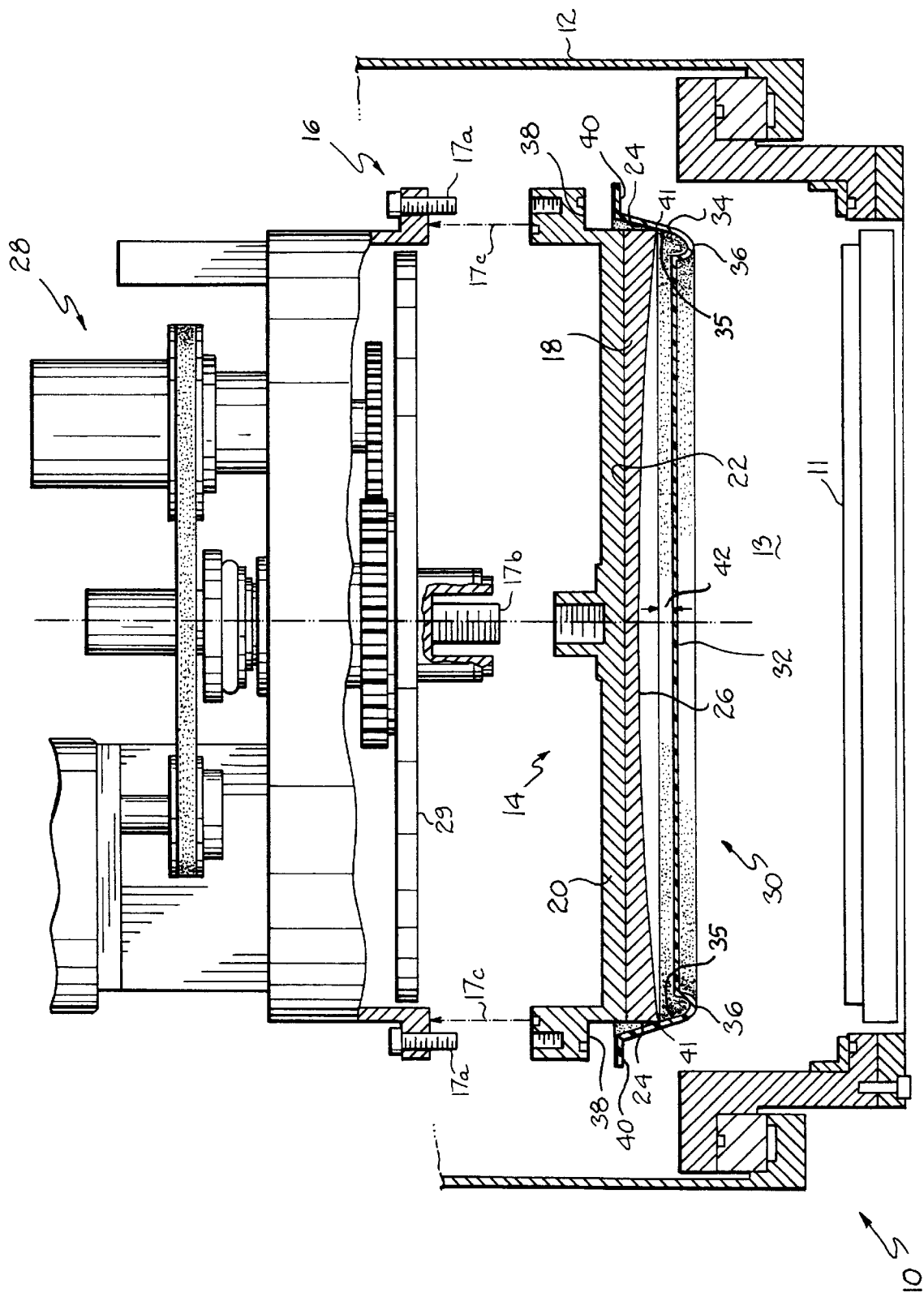

SPUTTERING TARGET PROTECTION DEVICE

FIELD OF THE INVENTION

The present invention relates generally to sputtering systems and target assemblies and, more particularly, to devices for protecting surfaces of a sputtering target during shipment, intermediate handling and installation of the target.

BACKGROUND OF THE INVENTION

Sputter coating refers to a process for coating a substrate, such as a semiconductor wafer, which is mounted within a vacuum processing chamber of a sputtering system. In the sputter coating process, an applied electric field positively biases the wafer with respect to an oppositely mounted, negatively biased target made of sputtering material. Once the processing chamber is evacuated, an inert gas is introduced into the chamber at a low pressure, and the applied electric field ionizes the process gas. As a result, positive ions from the gas bombard the target to cause sputtering of the target material onto the wafer in a thin film. A magnet or electromagnet may be located behind the target to provide a magnetic field above the surface of the target facing the wafer to confine the ion "plasma" adjacent the target, and thereby enhance the sputter coating operation.

Sputtering targets are typically formed as a generally circular disk of target material, such as aluminum alloys, gold, silver, copper, titanium, or platinum, which are soldered or otherwise bonded to a supporting target backplate. Alternatively, the sputtering target may be formed as one-piece, without the need for a supporting target backplate. The combination of the target material and backplate form a replaceable target assembly which is shipped by the target manufacturer to a user's facility for installation in a sputtering process chamber. As used herein, the term "target assembly" includes sputtering targets which are either one-piece, or which include a supporting target backplate.

Typically, the sputtering target has a precisely machined target surface which is mounted to face an oppositely oriented surface of a wafer to be coated. As will be appreciated by those skilled in the art, imperfections in the target surface, which may be caused by scratches, contamination from foreign particles, chemicals, or fingerprints, for example, can drastically adversely affect the performance and overall life of the target. For this reason, target manufacturers have shipped targets in sealed packages to protect the target during transportation and intermediate handling of the target before installation in the sputtering system.

However, known shipping and handling packages for sputtering targets have typically encompassed the entire target so that the packaging must be removed before the target may be installed in the sputtering chamber. Thus, while the packaging may have protected the target surface during shipment and handling of the target prior to installation, the target assembly, now removed from its packaging, is highly susceptible to mechanical and chemical contamination during the installation process. Moreover, known target packaging systems have no provision to ensure that the packaging material does not itself contact the precisely machined target surface during shipment and handling of the packaged target assembly.

Accordingly, there is a need for a sputtering target protection device which is adapted to protect the sputtering surface of a target during shipment, intermediate handling and installation of the target assembly in a sputtering chamber. There is also a need for a sputtering target protection device which ensures that the target packaging does not contact the precisely machined surface of the target prior to installation. Moreover, there is a need for a sputtering target protection device which is constructed to be single-use and disposable, thereby providing an economical packaging for sputtering targets.

SUMMARY OF THE INVENTION

To these ends, a unique protection device is provided for covering and protecting the precisely machined and engineered surface of a sputtering target during shipment, intermediate handling and installation of the target assembly. In accordance with the principles of the present invention, the protection device includes a top wall preferably having the same general circumferential configuration as the top surface of the target, and an integral skirt which depends from the top wall. Preferably, the top wall and integral depending skirt are molded from a low-shedding material, such as clear polyethylene terephthalate glass, with an anti-static additive to keep particulates away from the top surface of the target assembly. In use, the protection device is placed over the target assembly, with the integral skirt of the protection device frictionally engaging a circumferential side surface of the sputtering target. The top wall of the protection device is spaced from the sputtering surface to prevent contact between the target packaging and delicate sputtering surface. The top wall and depending skirt of the protection device serve to cover and protect the sputtering surface of the target during shipment, intermediate handling and installation of the target assembly.

The above features and advantages of the present invention will be better understood with reference to the accompanying figure and detailed description.

BRIEF DESCRIPTION OF THE DRAWINGS

Reference will now be made to the accompanying Figure from which the novel features and advantages of the present invention will be apparent:

The Figure is a side elevational view, partially in cross-section, showing a sputtering target protection device mounted to a target assembly in accordance with the principles of the present invention.

DETAILED DESCRIPTION OF THE INVENTION

With reference to the Figure, a conventional cathode sputtering system is shown generally as numeral 10 for sputter coating of a wafer 11 in a processing chamber 12. The sputtering system 10 does not form any part of the present invention per se, and may be of the type shown in U.S. Pat. Nos. 4,909,695 and 5,130,005, both assigned to the assignee of the present invention, which are expressly incorporated herein by reference in their entirety.

As is well known in the art, the sputtering system 10 includes a vacuum sputter chamber 13 in the interior of which is located a sputtering target assembly 14. The target assembly 14 is mounted on a target support 16 located above the target assembly 14 through a series of circumferentially spaced fasteners 17a and a centrally threaded shaft 17b. Target assembly 14, while shown in the Figure as removed and separated from the target support 16, is adapted to be mounted to the target support 16 in the direction of arrows 17c. The removable target assembly 14 includes a disk of sputtering target material 18 which is one-piece or soldered or otherwise bonded to a target backplate 20. Typically, the target material 18 is machined as a circular disk having a diameter which varies between ten and fourteen inches, for example, although other configurations and sizes of sputtering targets are possible.

As shown in the embodiment of the Figure, target material 18 has a generally planar rearward or bottom surface 22 which is bonded to the backplate 20, a circumferential edge or side surface 24 which extends generally transversely to the backplate 20, and a precisely machined forward or top surface 26 which faces the wafer to be coated within the processing chamber 12. While the target material 18 and backplate 20 do not form any part of the present invention per se, the configuration of the target material and backplate may be of the type shown in U.S. Pat. Nos. 5,336,386 and 5,474,667, both assigned to the assignee of the present invention, which are expressly incorporated herein by reference in their entirety. It will be appreciated that target material 18 may be machined to have a circular or elliptical circumferential configuration, and may have a diameter which varies between ten and fourteen inches, for example, as is conventional in the art. It will further be appreciated that in an alternative embodiment of target material 18 (not shown), the circumferential side surface 24 may be slightly tapered inwardly from the bottom surface 22 to the top surface 26. Sputtering system 10 further preferably includes a rotating magnet assembly 28 located above the target assembly 14 for rotatably supporting a series of magnets (not shown) on a magnet support 29. The rotating magnet assembly 28 provides a magnetic field adjacent the top surface 26 of the target facing the wafer to confine the ion "plasma" adjacent the target and thereby enhance the sputter coating process.

During the sputter coating process, target material 18 is eroded from the target assembly 14 and deposited in a thin film on the oppositely facing wafer 11 located within sputter chamber 13. At some point during the life of the target assembly 14, a sufficient amount of target material 18 is eroded from the target assembly, or the target assembly otherwise becomes damaged, that it must be removed from the processing chamber 12 and replaced with a new target assembly.

To this end, in accordance with the present invention, a sputtering target protection device or target cover 30 is provided to cover and protect the top surface 26 of the target material 18 during shipment, intermediate handling and installation of the target assembly 14. In particular, the protection device 30, shown in cross-section along its diameter, includes a top wall 32, preferably having the same general circumferential configuration as the top surface 26 of the target, and an integral skirt 34 which depends from the top wall 32. Integral skirt 34 includes an inner surface 35. Preferably, the skirt 34 is frusto-conically shaped and extends radially outwardly and downwardly from the top wall 32 at approximately a 15° angle. An integral annular shoulder 36 is preferably formed at the juncture of the top wall 32 and the depending shirt 34 to add strength and rigidity to the protection device 30 which is preferably molded of a low-shedding material, such as clear polyethylene terephthalate glass (PETG), with a conventional anti-static additive to keep particulates away from the top surface 36 of target material 18.

As shown in the Figure, the backplate 20 of target assembly 14 has an annular peripheral flange 38 which extends radially outwardly beyond the circumferential side surface 24 of the target material 18. The depending integral skirt 34 of protection device 30 preferably includes an annular peripheral flange 40 which extends radially outwardly from a lower edge of the skirt. In accordance with the principles of the present invention, the protection device 30 is positioned on the target assembly 14 prior to shipment as shown in the Figure. In this position, the inner surface 35 of depending skirt 34 is adapted to frictionally engage the circumferential side surface 24 of target material 18, such as at 41, for removable engagement of the protection device 30 with the target assembly 14. Additionally, in the fully engaged position as shown in the Figure, the top wall 32 of the protection device 30 is separated from the top surface 26 of the target material 18 by a small gap, shown generally as numeral 42, to ensure that the top wall 32 does not contact the sputtering surface 26 during shipment, intermediate handling and installation of the target assembly 14.

Thus, during shipment and installation of the target assembly 14, inner surface 35 of the protection device 30 is positioned on the target assembly 14 with the inner surface 35 of integral skirt 34 engaging the circumferential side surface 24 of target material 18. Due to the flexible nature of the material used to fabricate the protection device 30, the skirt 34 frictionally engages, without damaging, the circumferential side surface 24 of the target material 18. In this position, the protection device 30 is removably but securely engaged with the target assembly 24, with the top wall 32 and depending skirt 34 of the protection device covering and protecting the sputtering surface 26 of the target. After the target assembly 14 has been installed in the processing chamber 12, the protection device 30 may then be removed from the target assembly by simply disengaging the depending skirt 34 from the circumferential side surface 24 of the target material 18. Protection device 30 may then be discarded.

Those skilled in the art will readily appreciate that the present invention provides a novel target assembly packaging device for protecting the sputtering surface of a target during shipment and installation of the target assembly. As the protection device 30 is not removed until after the target assembly 14 has been installed in the sputtering system 10, the potential of damaging a target during installation is greatly reduced. Moreover, the risk of contaminating the sputtering surface of the target by human contact during installation is substantially eliminated. The protection device of the present invention takes advantage of low-shedding materials with anti-static properties to prevent particulate contamination of the target sputtering surface. The protection device of the present invention may be readily molded as a single piece for use with a variety of target configurations and sizes. The construction of the protection device, and its cooperation with the target assembly, ensures that the packaging never comes in contact with the sputtering surface of the target. Moreover, the target protection device is adapted to be a single-use and disposable, thereby providing an economical packaging for target assemblies.

From the above disclosure of the general principles of the present invention and the preceding detailed description of preferred embodiments, those skilled in the art will readily comprehend the various modifications to which the present invention is susceptible. For example, while PETG material is preferred for molding of the protection device 30, it is contemplated that other materials could be used without departing from the spirit or scope of the present invention. Additionally, it will be appreciated that while depending skirt 34 is described as being integral with top wall 26, the components of protection device 30 may be manufactured separately and then joined as an integral protection device without departing from the spirit or scope of the present invention. The invention in its broader aspects is therefore not limited to the specific details and illustrative example shown and described. Accordingly, departures may be made from such details without departing from the spirit or scope of Applicants' general inventive concept. Therefore, Applicants desire to be limited only by the scope of the following claims and equivalents thereof:

Having described the invention, we claim:

1. A device for covering and protecting surfaces of a sputtering target during shipment and installation thereof in a sputtering system, said target having a top surface with a circumferential, a bottom surface and a side surface extending circumferentially thereabout, comprising:

a top wall; and an integral skirt depending from said top wall at a juncture to thereby define a target cover for covering at least the top surface of said target, said integral skirt having an inner surface that frictionally engages the circumferential side surface of said target for removable engagement of said target cover with said target during installation thereof in a sputtering system.

2. The device of claim 1 wherein said top wall of said target cover is separated from the top surface of said target when said target cover is engaged with said target.

3. The device of claim 1 wherein said top wall has substantially the same circumferential configuration as the top surface of said target.

4. The device of claim 1 further including an integral annular shoulder formed proximate the juncture of said top wall and said integral depending skirt.

5. The device of claim 1 wherein said target cover includes a peripheral flange extending radially outwardly from said depending skirt.

6. The device of claim 1 wherein said target cover is formed of polyethylene terephthalate glass.

7. A device for covering and protecting surfaces of a sputtering target during shipment and installation thereof in a sputtering system, said target having a top surface with a circumferential, a bottom surface and a side surface extending circumferentially thereabout, comprising:

a top wall having substantially the same circumferential configuration as the top surface of said target; and an integral, frusto-conically shaped skirt depending from said top wall at a juncture to thereby define a target cover for covering at least the top surface of said target, said integral skirt having an inner surface that frictionally engages the circumferential side surface of said target for removable engagement of said target cover with said target during installation thereof in a sputtering system.

8. The device of claim 7 wherein said top wall of said target cover is separated from the top surface of said target when said target cover is engaged with said target.

9. The device of claim 7 further including an integral annular shoulder formed proximate the juncture of said top wall and said integral depending skirt.

10. The device of claim 7 wherein said target cover includes a peripheral flange extending radially outwardly from said depending skirt.

11. The device of claim 7 wherein said target cover is formed of polyethylene terephthalate glass.

12. A pre-packaged target assembly for installation in a sputtering system, comprising:

a backplate;

a sputtering target mounted to said backplate and having a top surface with a circumferential configuration, a bottom surface and a side surface extending circumferentially thereabout; and a target cover having a top wall and an integral skirt depending from said top wall at a juncture for covering at least the top surface of said target, said integral skirt having an inner surface that frictionally engages the circumferential side surface of said target for removable engagement of said target cover with said target during installation thereof in a sputtering system.

13. The target assembly of claim 12 wherein said top wall of said target cover is separated from the top surface of said target when said target cover is engaged with said target.

14. The target assembly of claim 12 wherein said top wall has substantially the same circumferential configuration as the top surface of said target.

15. The device of claim 12 further including an integral annular shoulder formed proximate the juncture of said top wall and said integral depending skirt.

16. The device of claim 12 wherein said target cover includes a peripheral flange extending radially outwardly from said depending skirt.

17. The device of claim 1 wherein said target cover is formed of polyethylene terephthalate glass.

18. A pre-packaged target assembly for installation in a sputtering system, comprising:

a one-piece sputtering target having a top surface, a bottom surface and a side surface extending circumferential thereabout; and a target cover having a top wall and an integral skirt depending from said top wall for covering at least the top surface of said target, said integral skirt having an inner surface that frictionally engages the circumferential side surface of said target for removable engagement of said target cover with said target during installation thereof in a sputtering system.

19. A method of shipping and installing a target in a sputter coating system, comprising the steps of:

covering a top surface of said target with a target cover wherein said target cover includes a top wall and an integral skirt depending from said top wall for covering at least the top surface of said target, said integral skirt having an inner surface that frictionally engages a circumferential side surface of said target for removable engagement of said target cover with said target during installation thereof in the sputter coating system;

transporting said covered target to the sputter coating system, mounting s aid covered target on a target support within the sputter coating system; and removing said target cover from said target after installation thereof in the sputter coating system.

* * * * *

UNITED STATES PATENT AND TRADEMARK OFFICE
CERTIFICATE OF CORRECTION

PATENT NO. : 5,846,389
DATED : December 8, 1998
INVENTOR(S) : Levine et al.

It is certified that error appears in the above-identified patent and that said Letters Patent is hereby corrected as shown below:

Column 4, line 17, please delete "inner surface 35 of".

Column 5, line 13, after "circumferential" insert -connfiguration--.

Column 5, line 40, after "circumferential" insert- connfiguration

Column 6, line 54, please delete "," and replace with --;--.

Column 6, line 55, please delete "s aid" and replace with --said--.

Signed and Sealed this

Twentieth Day of July, 1999

Attest:

Attesting Officer

Q. TODD DICKINSON

Acting Commissioner of Patents and Trademarks